(12) United States Patent
Mehrotra et al.

(10) Patent No.: US 11,387,348 B2
(45) Date of Patent: Jul. 12, 2022

(54) TRANSISTOR FORMED WITH SPACER

(71) Applicant: NXP USA, INC., Austin, TX (US)

(72) Inventors: Saumitra Raj Mehrotra, Scottsdale, AZ (US); Ljubo Radic, Gilbert, AZ (US); Bernhard Grote, Phoenix, AZ (US)

(73) Assignee: NXP USA, INC., Austin, TX (US)

( * ) Notice: Subject to any disclaimer, the term of this patent is extended or adjusted under 35 U.S.C. 154(b) by 84 days.

(21) Appl. No.: 16/692,517

(22) Filed: Nov. 22, 2019

(65) Prior Publication Data

US 2021/0159323 A1 May 27, 2021

(51) Int. Cl.
| | |
|---|---|
| *H01L 29/66* | (2006.01) |
| *H01L 29/78* | (2006.01) |
| *H01L 27/088* | (2006.01) |
| *H01L 29/40* | (2006.01) |

(52) U.S. Cl.
CPC ...... *H01L 29/66704* (2013.01); *H01L 27/088* (2013.01); *H01L 29/407* (2013.01); *H01L 29/7825* (2013.01)

(58) Field of Classification Search
CPC combination set(s) only.
See application file for complete search history.

(56) References Cited

U.S. PATENT DOCUMENTS

| | | | |
|---|---|---|---|
| 4,553,151 A | 11/1985 | Schutten et al. | |
| 4,893,160 A | 1/1990 | Blanchard | |
| 5,316,959 A | 5/1994 | Kwan et al. | |
| 5,324,683 A | 6/1994 | Fitch et al. | |
| 5,407,860 A | 4/1995 | Stoltz et al. | |
| 5,434,435 A | 7/1995 | Baliga | |
| 5,723,891 A | 3/1998 | Malhi | |
| 5,736,446 A | 4/1998 | Wu et al. | |
| 5,770,507 A | 6/1998 | Chen et al. | |
| 5,869,379 A | 2/1999 | Gardner et al. | |
| 5,914,519 A | 6/1999 | Chou et al. | |
| 6,064,107 A | 5/2000 | Yeh et al. | |
| 6,277,700 B1 | 8/2001 | Yu et al. | |
| 6,858,500 B2 | 2/2005 | Sugi et al. | |
| 6,861,332 B2 | 3/2005 | Park et al. | |
| 6,864,135 B2 | 3/2005 | Grudowski et al. | |

(Continued)

FOREIGN PATENT DOCUMENTS

WO 2005093841 A2 10/2005

OTHER PUBLICATIONS

Non-final office action dated Apr. 14, 2021 in U.S. Appl. No. 16/836,344.

(Continued)

*Primary Examiner* — Mark W Tornow
*Assistant Examiner* — Priya M Rampersaud
(74) *Attorney, Agent, or Firm* — David G. Dolezal

(57) ABSTRACT

Disclosed herein is a transistor structure that is formed by forming a sidewall spacer along a first vertical component sidewall of a trench wherein no sidewall spacer is formed along a second vertical component sidewall of the trench. During an etching of a dielectric layer in the trench, the sidewall spacer protects a first portion of the dielectric layer from being etched while a second portion of the dielectric layer along the second sidewall is etched. A portion of a control terminal can be formed in the space where the second portion is removed.

20 Claims, 15 Drawing Sheets

(56) References Cited

U.S. PATENT DOCUMENTS

| | | |
|---|---|---|
| 6,946,348 B2 | 9/2005 | Zeng |
| 7,368,785 B2 | 5/2008 | Chen et al. |
| 7,400,024 B2 | 7/2008 | Kunnen |
| 7,576,388 B1 | 8/2009 | Wilson et al. |
| 7,579,650 B2 | 8/2009 | Cao et al. |
| 7,709,889 B2 | 5/2010 | Moens et al. |
| 7,759,206 B2 | 7/2010 | Luo et al. |
| 7,800,167 B2 | 9/2010 | Kitamura et al. |
| 7,893,488 B2 | 2/2011 | Hebert |
| 7,923,776 B2 | 4/2011 | Yilmaz et al. |
| 8,043,913 B2 | 10/2011 | Yilmaz et al. |
| 8,304,312 B2 | 11/2012 | Hebert |
| 8,319,278 B1 | 11/2012 | Zeng et al. |
| 8,329,538 B2 | 12/2012 | Pan et al. |
| 8,502,287 B2 | 8/2013 | Radic et al. |
| 8,647,950 B2 | 2/2014 | Zuniga et al. |
| 8,716,794 B2 | 5/2014 | Luo et al. |
| 8,742,495 B2 | 6/2014 | Parthasarathy et al. |
| 8,981,470 B2 | 3/2015 | Nozu |
| 9,171,931 B2 | 10/2015 | Ng et al. |
| 9,559,198 B2 | 1/2017 | Stefanov et al. |
| 9,620,583 B2 | 4/2017 | Kelkar et al. |
| 10,103,257 B1 | 10/2018 | Qin et al. |
| 10,424,646 B2 | 9/2019 | Mehrotra et al. |
| 10,600,911 B2 | 3/2020 | Grote et al. |
| 2004/0021233 A1 | 2/2004 | Kinzer et al. |
| 2006/0001084 A1 | 1/2006 | Kelly et al. |
| 2006/0017078 A1 | 1/2006 | Thapar |
| 2006/0209586 A1 | 9/2006 | Hirler |
| 2007/0274110 A1 | 11/2007 | Kitamura et al. |
| 2009/0256212 A1* | 10/2009 | Denison ............ H01L 29/7825 257/408 |
| 2010/0006929 A1 | 1/2010 | Andou |
| 2010/0015770 A1 | 1/2010 | Tai et al. |
| 2010/0244125 A1 | 9/2010 | Sonsky et al. |
| 2013/0105887 A1* | 5/2013 | Zuniga ............... H01L 29/7825 438/270 |
| 2013/0105888 A1 | 5/2013 | Zuniga et al. |
| 2013/0181723 A1 | 7/2013 | Mauder et al. |
| 2013/0334565 A1 | 12/2013 | Hutzler et al. |
| 2014/0021534 A1* | 1/2014 | Verma ............... H01L 21/82385 438/270 |
| 2014/0097492 A1 | 4/2014 | Yu |
| 2014/0138739 A1 | 5/2014 | Magri et al. |
| 2014/0225186 A1 | 8/2014 | Abou-Khalil et al. |
| 2015/0084123 A1 | 3/2015 | Kawashiri et al. |
| 2015/0137223 A1 | 5/2015 | Siemieniec et al. |
| 2015/0380348 A1 | 12/2015 | Noebauer et al. |
| 2015/0380538 A1 | 12/2015 | Ogawa |
| 2016/0020315 A1 | 1/2016 | Hirler |
| 2016/0211348 A1 | 7/2016 | Yoshida |
| 2016/0268423 A1 | 9/2016 | Koepp et al. |
| 2016/0359029 A1 | 12/2016 | Zeng et al. |
| 2017/0263767 A1 | 9/2017 | Nishiwaki |
| 2017/0338337 A1 | 11/2017 | Bobde et al. |
| 2018/0006026 A1 | 1/2018 | Lui |
| 2018/0006109 A1 | 1/2018 | Mauder et al. |
| 2018/0099490 A1 | 3/2018 | Lin et al. |
| 2019/0097045 A1 | 3/2019 | Grote et al. |
| 2019/0097046 A1 | 3/2019 | Mehrotra et al. |
| 2019/0206987 A1 | 7/2019 | Adachi et al. |
| 2019/0280094 A1 | 9/2019 | Grote et al. |

OTHER PUBLICATIONS

Cha, H., "0.18um 100V-rated BCD with Large Area Power LDMOS with ultra-low effective Specific Resistance", IEEE 2016.

Cheng, K., "Air Spacer for 10nm FinFET CMOS and Beyond", IEEE 2016.

Chil, M., "Advanced 300mm 130NM BCD technology from 5V to 85V with Deep-Trench Isolation", IEEE 2016.

Fujishima, D.H., "Integrated Bi-directional Trench Lateral Power MOSFETs for One Chip Lithium-ion Battery Protection ICs", Proceedings of the 17 International Symposium on Power Semiconductor Devices & IC's, Santa Barbara, CA, May 23-26, 2005.

Huang, T., "0.18um BCD Technology with Best-in-Class LDMOS from 6 V to 45 V", Proceedings of the 26th International Symposium on Power Semiconductor Devices & IC's, Jun. 15-19, 2014.

Kumar, M., "Extended-p+ Stepped Gate LDMOS for Improved Performance", IEEE Transactions on Electron Devices, vol. 57, No. 7, Jul. 2010.

Lu, D.H., "Integrated Bi-directional Trench Lateral Power MOSFETs for One Chip Lithium-ion Battery Protection ICs", Proceedings of the 17th International Symposium on Power Semiconductor Devices & IC's, May 23-26, 2005.

Takaya, H., "Floating Island and Thick Bottom Oxide Trench Gate MOSFET (FITMOS)—A 60V Ultra Low On-Resistance Novel MOSFET with Superior Internal Body Diode-", Proceedings of the 17th International Symposium on Power Semiconductor Devices & IC's, May 23-26, 2005.

Yang, H., "Low-Leakage SMARTMOS 10W Technology at 0.13um Node with Optimized Analog, Power and Logic Devices for SOC Design", IEEE 2008.

Yang, H., "Approach to the Silicon Limit: Advanced NLDMOS in 0.13 um SOI Technology for Automotive and Industrial Applications up to 110V", Proceedings of the 25th International Symposium on Power Semiconductor Devices & ICs, Kanazawa, 2013.

Zhigang, W., "Analysis of OFF-state and ON-state performance in a silicon-on-insulator power MOSFET with a low-k dielectric trench", Chinese Institute of Electronics, Journal of Semiconductors, vol. 34, No. 7, Jul. 2013.

U.S. Appl. No. 16/141,674, filed Sep. 25, 2018, entitled "Transistor Devices With Control-Terminal Field Plate Structures in Trenches".

U.S. Appl. No. 16/171,830, filed Oct. 26, 2018, entitled "Transistor Devices With Extended Drain Regions Located in Trench Sidewalls".

U.S. Appl. No. 16/174,955, filed Oct. 30, 2018, entitled "Vertical Transistor With Extended Drain Region".

U.S. Appl. No. 16/205,461, filed Nov. 30, 2018, entitled "Transistor With Gate/Field Plate Structure".

Non-final office action dated Oct. 15, 2018 in U.S. Appl. No. 15/715,816.

Non-final office action dated Nov. 16, 2018 in U.S. Appl. No. 15/715,852.

Non-final office action dated Feb. 21, 2019 in U.S. Appl. No. 15/715,816.

Ex-Parte Quayle action dated Mar. 5, 2019 in U.S. Appl. No. 15/715,852.

Non-final office action dated Apr. 9, 2019 in U.S. Appl. No. 15/715,831.

Ex-Parte Quayle action dated Apr. 24, 2019 in U.S. Appl. No. 15/715,852.

Final office action dated Jun. 7, 2019 in U.S. Appl. No. 15/715,816.

Notice of Allowance dated Jul. 9, 2019 in U.S. Appl. No. 15/715,852.

Final office action dated Jul. 18, 2019 in U.S. Appl. No. 15/715,831.

Non-final office action dated Jul. 25, 2019 in U.S. Appl. No. 15/918,563.

Non-final office action dated Aug. 8, 2019 in U.S. Appl. No. 15/715,816.

Notice of Allowance dated Sep. 25, 2019 in U.S. Appl. No. 15/715,831.

Final office action dated Nov. 19, 2019 in U.S. Appl. No. 15/715,816.

U.S. Appl. No. 17/139,820, filed Dec. 31, 2020, entitled "Transistor Devices With Termination Regions".

Notice of Allowance dated Apr. 21, 2021 in U.S. Appl. No. 16/836,293.

Notice of Allowance dated Aug. 21, 2020 in U.S. Appl. No. 16/171,830.

Notice of Allowance dated Sep. 27, 2021 in U.S. Appl. No. 16/836,344.

U.S. Appl. No. 16/715,396, filed Dec. 16, 2019, entitled "Transistor With Extended Drain Region".

Ex-Parte Quayle dated Jan. 7, 2020 in U.S. Appl. No. 16/174,955.

Notice of Allowance dated Jan. 21, 2020 in U.S. Appl. No. 15/715,816.

Non-final office action dated May 12, 2021 in U.S. Appl. No. 16/141,674.

(56) References Cited

OTHER PUBLICATIONS

Non-final office action dated May 21, 2021 in U.S. Appl. No. 16/715,396.
U.S. Appl. No. 16/836,293, filed Mar. 31, 2020, entitled Transistor Trench With Field Plate Structure.
U.S. Appl. No. 16/836,344, filed Mar. 31, 2020, entitled Trench With Different Transverse Cross-Sectional Widths.
Notice of Allowance dated Apr. 21, 2020 in U.S. Appl. No. 16/174,955.
Non-finai office action dated May 4, 2020 in U.S. Appl. No. 16/171,830.
Qiao, M., "A Novel Substrate-Assisted RESURF Technology for Small Curvature Radius Junction", Proceedings of the 23rd International Symposium on Power Semiconductor Devices & IC's, May 23-26, 2011.
Notice of Allowance dated Feb. 4, 2020 in U.S. Appl. No. 15/918,563.
Notice of Allowance dated Jun. 24, 2020 in U.S. Appl. No. 16/205,461.
Notice of Allowance dated Nov. 22, 2021 in U.S. Appl. No. 16/715,396.

* cited by examiner

TRANSISTOR FORMED WITH SPACER

BACKGROUND OF THE INVENTION

Field of the Invention

This invention relates in general to transistor devices and more specifically to transistor devices formed with a spacer.

Background

Some types of transistors such as power transistors, high voltage devices, and RF devices (e.g. laterally diffused metal oxide semiconductor (LDMOS), drain extended MOS (DEMOS)) include extended drain regions located in a carrier path between the drain region and the channel region. An extended drain region of a transistor has the same net conductivity type as the drain region of the transistor. An extended drain region may provide a transistor with a higher breakdown voltage in that most of the voltage applied to the drain region is dropped across the drift region of the extended drain region.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The Figures are not necessarily drawn to scale.

DETAILED DESCRIPTION

The following sets forth a detailed description of a mode for carrying out the invention. The description is intended to be illustrative of the invention and should not be taken to be limiting.

Disclosed herein is a transistor structure that is formed by forming a sidewall spacer along a first vertical component sidewall of a trench wherein no sidewall spacer is formed along a second vertical component sidewall of the trench. During an etching of a dielectric layer in the trench, the sidewall spacer protects a first portion of the dielectric layer from being etched while a second portion of the dielectric layer along the second sidewall is etched. According a control terminal structure (e.g. a gate structure for a FET) can include a portion located in the space where the first portion of the dielectric layer was removed such that the portion of the control terminal structure can be formed closer to the bottom of a trench than a field plate structure or other portions of the control terminal structure that act as a field plate structure.

One advantage of such a transistor device is that the width of the portion of the control terminal structure closest to the bottom of the trench can be controlled independently with respect to the distance between the field plate structure and the bottom of the trench or a portion of the control terminal used as the field plate structure.

FIGS. 1-9 set forth partial cutaway side views of various stages of a wafer in the manufacture of a transistor device according to one embodiment of the present invention.

Figure 1:
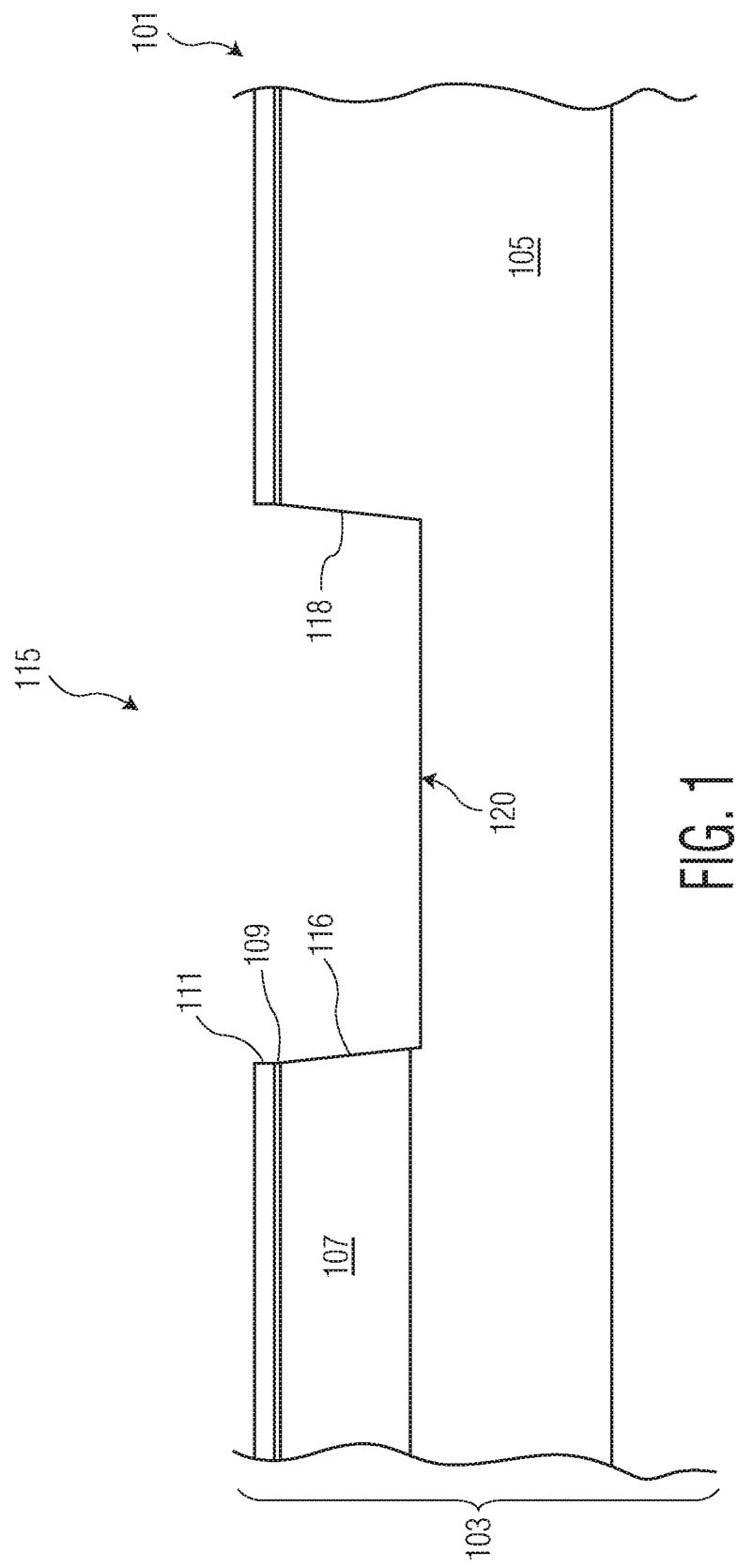
FIGS. 1-9 set forth partial cutaway side views of various stages in the manufacture of a transistor device according to one embodiment of the present invention.

FIG. 1 is a partial cutaway side view showing a portion of wafer 101 with a trench 115 formed therein. In one embodiment, wafer 101 includes a substrate 103 of semiconductor material. In one embodiment, substrate 103 has a P-type conductivity doping. In one embodiment, substrate 103 is doped with boron at a concentration of about $2e15/cm^3$, but may be doped with other types of dopants and/or may be at other concentrations in other embodiments. In one embodiment, substrate 103 is made of monocrystalline silicon, but may be made of other semiconductor materials (e.g. silicon germanium, germanium, silicon carbide, gallium nitride, gallium arsenide, other semiconductor III-V materials) in other embodiments. In yet another embodiment, substrate 103 may be a semiconductor-on-insulator (SOI) substrate where the trenches are formed in the semiconductor layer located above an insulator layer (not shown). In other embodiments, substrate 103 may be made of layers of different semiconductor material and/or include other regions (not shown) of different conductivity types (e.g. a buried N-type region).

Substrate 103 includes a region 105 implanted with N-type dopants. In one embodiment, region 105 is implanted with phosphorous dopants at an energy of 100-1000 keV and at a dosage of $1e^{11}$-$1e^{13}/cm^2$, but may be implanted with other types of dopants, at other energies, and at other dosages in other embodiments. In one embodiment, region 105 can be part of an N-type epi growth region with a doping concentration of $5e^{15}$-$5e^{17}/cm^3$. In one embodiment, after implantation, wafer 101 is annealed where the dopants diffuse to the location of region 105 shown in FIG. 1. After diffusion, the dopants have a desired concentration for extended drain regions for subsequently formed transistors.

A P-well region 107 is selectively formed in an upper portion of region 105 in substrate 103. In one embodiment, P-well region 107 is formed by selectively implanting P-type dopants into a top portion of substrate 103 through a patterned mask (not shown). In one embodiment, the P-type dopants are boron and are implanted at an energy of 20-200 keV and at a dosage of $5e^{11}$-$5e^{13}/cm^2$, but may include other types of dopants, implanted at other energies, and/or at other doping concentrations in other embodiments. In one embodiment, after the implantation of the P-type dopants, wafer 101 is annealed where the dopants diffuse to the location of P-well region 107 as shown in FIG. 1.

After the implantation of the P-type dopants, a pad oxide layer 109 and a nitride layer 111 are formed on substrate 103. Afterwards, a trench 115 is formed in wafer 101. The formation of trench 115 forms vertical sidewalls 116 and 118 in substrate 103 and a bottom portion 120. In one embodiment, trench 115 is formed by forming a patterned mask (not shown) on wafer 101 and then anisotropically etching layers 109 and 111 and then substrate 103 as per the pattern with the appropriate etch chemistries. In other embodiments, other types of hard mask layers may be utilized in forming trench 115. In one embodiment, trench 115 has a width of 1.0 µm and a depth of 0.4 µm, but may have other widths and/or depths in other embodiments.

Figure 2:
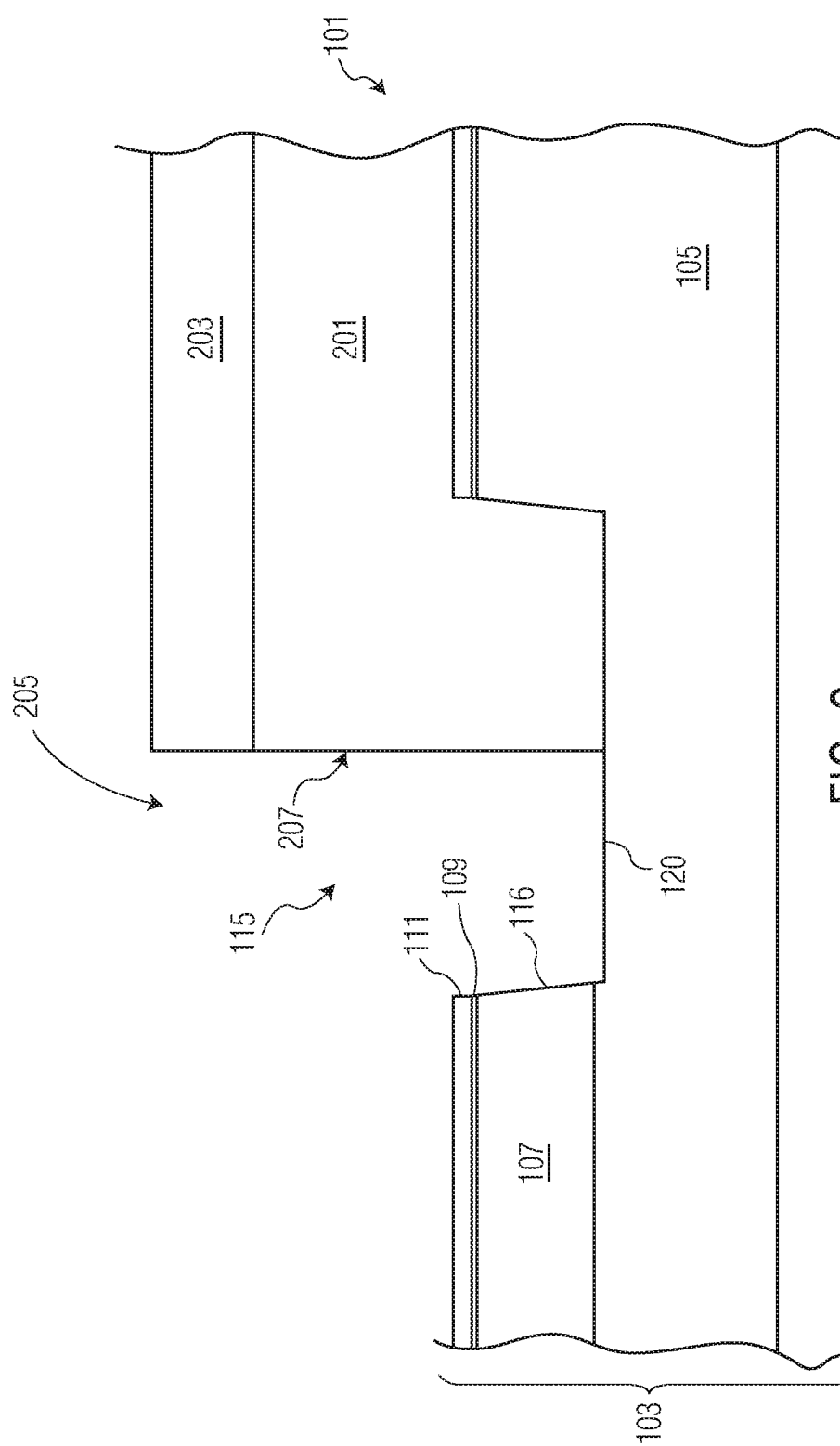

FIG. 2 is partial cutaway side view of wafer 101 after an oxide layer 201 and nitride layer 203 are formed on wafer 101 including in trench 115. In one embodiment, layer 201 has a thickness in the range of 0.5-5.0 µm but may have other thicknesses in other embodiments. In one embodiment, nitride layer 203 has a thickness in the range of 0.01-1.0 µm, but may have other thickness in other embodiments, Layers 201 and 203 are subsequently patterned and etched to form vertical sidewall 207 that is located in trench 115. In one embodiment, sidewall 207 is at least twice as high as sidewall 116. In other embodiments, the ratio of sidewall 116 to sidewall 207 is in the range of 0.1 to less than 1.0. In one embodiment, oxide layer 201 is etched with an anisotropic oxide etch (e.g. plasma etching in Ar/CHF$_3$) and nitride layer 203 is etched with a plasma etch in SF$_6$/CH$_4$/N$_2$/O$_2$, although other etchings may be used in other embodiments.

Figure 3:
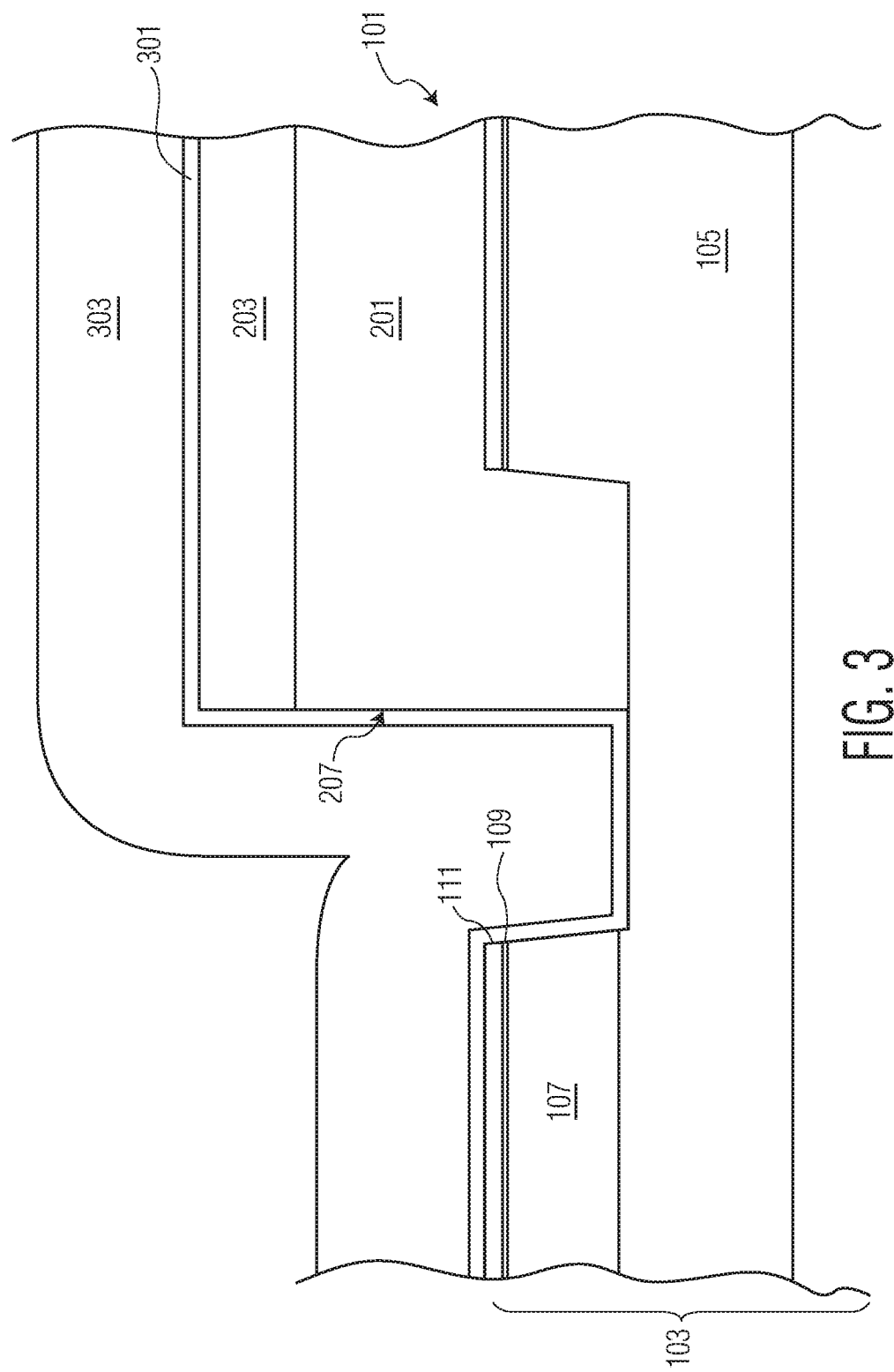

FIG. 3 is a partial cutaway side view of wafer 101 after a dielectric layer 301 is formed over wafer 101 followed by a layer 303 of spacer material. In one embodiment, layer 301 is made of an oxide and is formed over wafer 101 by a deposition process. In one embodiment, layer 301 has a thickness in the range of 0.05-0.5 µm, but may have other thicknesses in other embodiments. In some embodiments, the thickness of layer 301 is set so as to separate a subsequently formed field plate (701) or field plate portion of a gate (1503) at the appropriate distance from the bottom portion 120 of trench 115.

In one embodiment, layer 303 is made of a polycrystalline semiconductor material such as polysilicon or polysilicon germanium. However, layer 303 may be made by other materials in other embodiments including dielectric materials. In one embodiment, layer 303 is of a thickness in the range of 0.1-1.0 µm, but may have other thicknesses in other embodiments.

Figure 4:
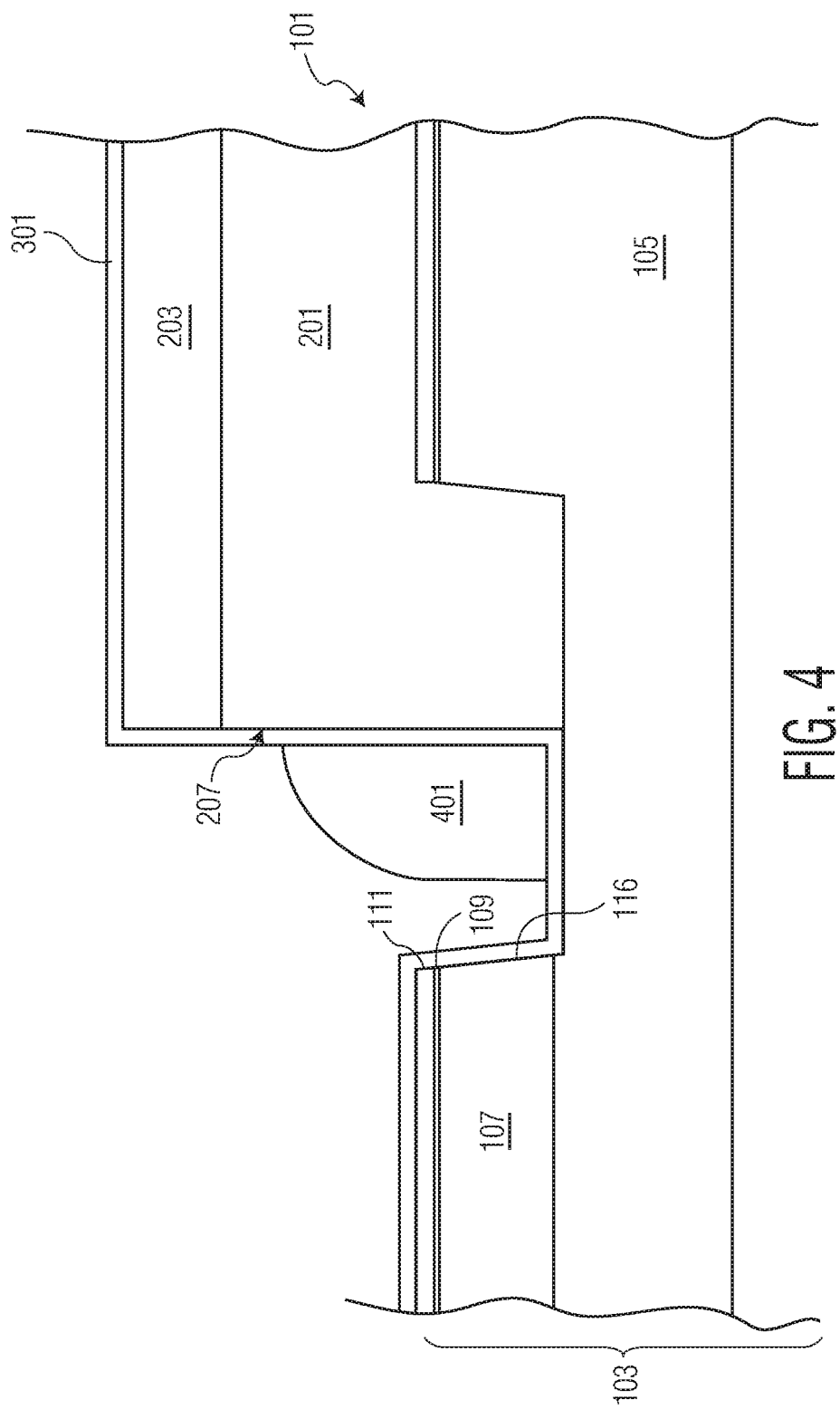

FIG. 4 is a partial cutaway side view of wafer 101 after layer 303 is etched to form sidewall spacer 401. In an embodiment where layer 303 is made of polysilicon, layer 303 is etched with an anisotropic polysilicon etch (e.g. Plasma etch) such that sidewall spacer 401 is formed along sidewall 207 but not formed along sidewall 116 as a result of the anisotropic etching. The fact that a spacer is formed along sidewall 207 and not sidewall 116 is due to the differences in heights of sidewalls 116 and 207 and to the length of etch time. As a result of the etching, a portion of layer 301 at the bottom of trench 115 is exposed and a second portion is covered by spacer 401.

Figure 5:
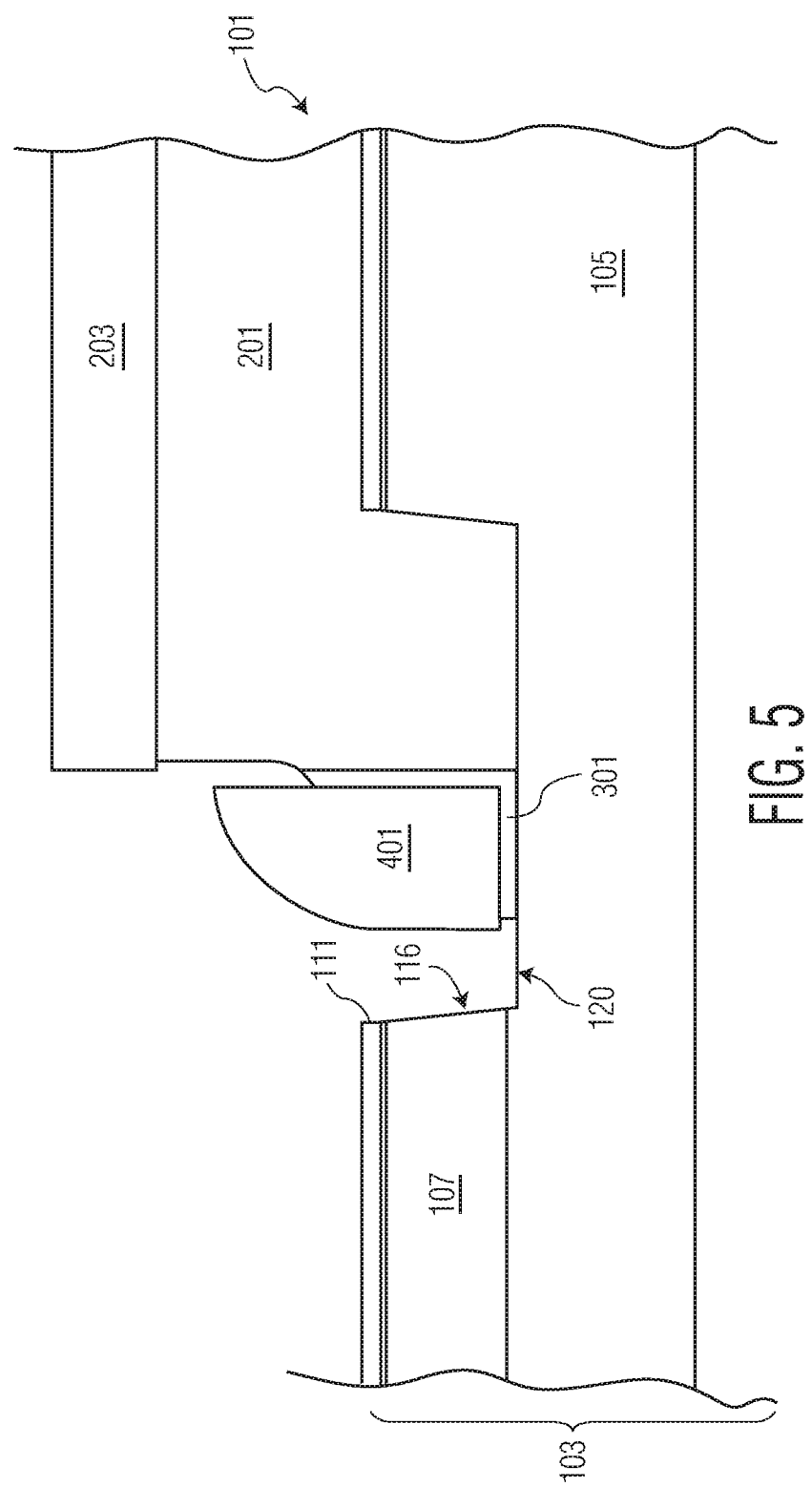

FIG. 5 is a partial cutaway side view of wafer 101 after dielectric layer 301 has been etched to expose a portion of bottom portion 120 of trench 115 and sidewall 116. In embodiments where layer 301 is an oxide, layer 301 is isotropically etched e.g. using BOE (buffered oxide etch). As shown in FIG. 5, spacer 401 protects a portion of layer 301 from being etched. However, portions of layer 301 may be removed with other etching processes in other embodiments.

Figure 6:
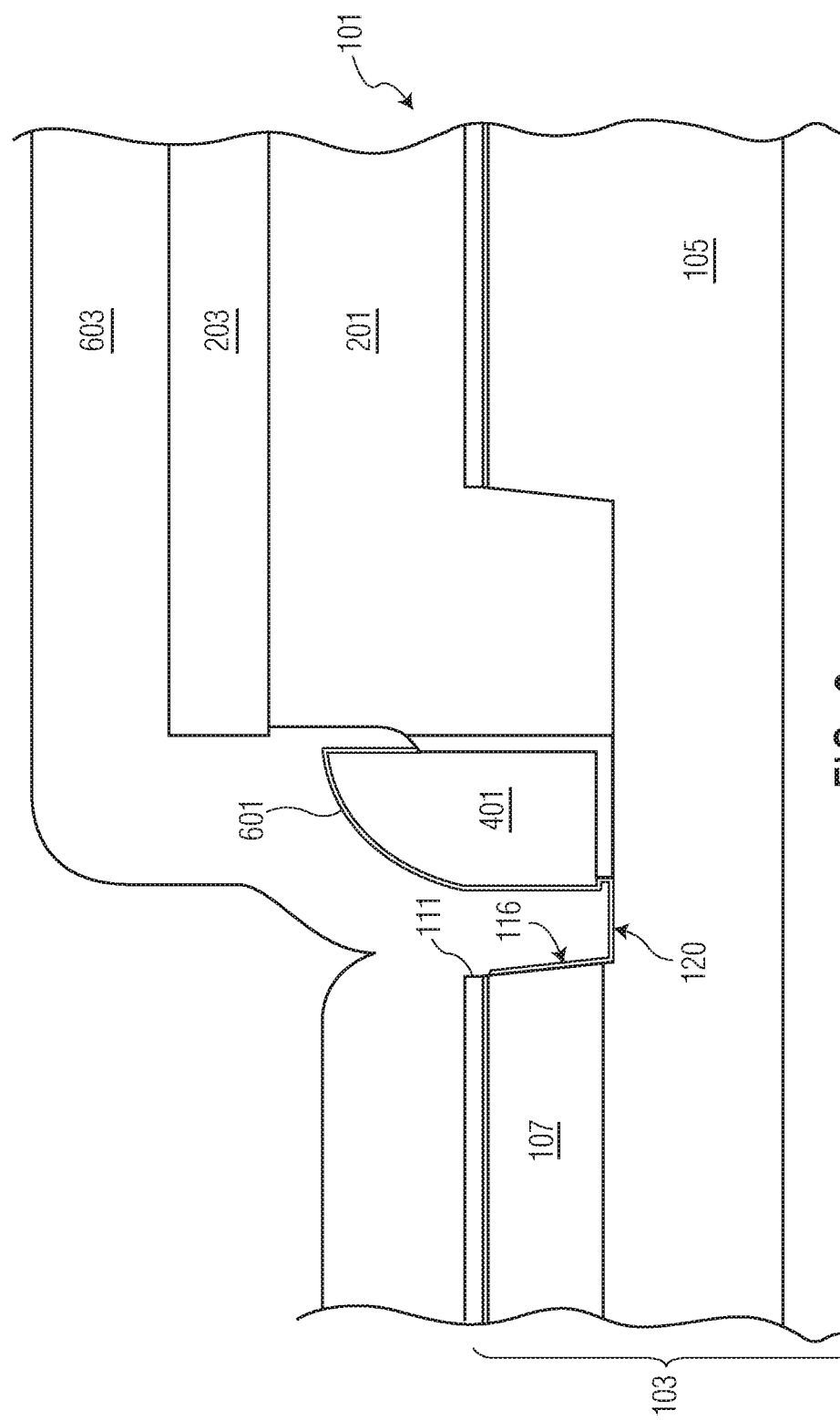

FIG. 6 is a partial cutaway side view of wafer 101 after a gate electric layer 601 is formed on sidewall 116, exposed bottom portion 120 and spacer 401. In one embodiment, layer 601 is formed by an oxidation process and has a thickness in the range of 0.01-0.5 µm. However, layer 601 can be formed by other processes in other embodiments, (e.g. a deposition process), be made of other materials (e.g. a high K dielectric), and be of other thicknesses in other embodiments.

After the formation of layer 601, a layer 603 of gate material is formed over wafer 101. In one embodiment, layer 603 is made of polysilicon and has a thickness in the range of 0.1-1.0 µm, but may be made of other materials and have other thicknesses in other embodiments. As shown in FIG. 6, layer 603 is formed in spaces of trench 115 where layer 301 was removed during the etching as described with respect to FIG. 5.

Figure 7:
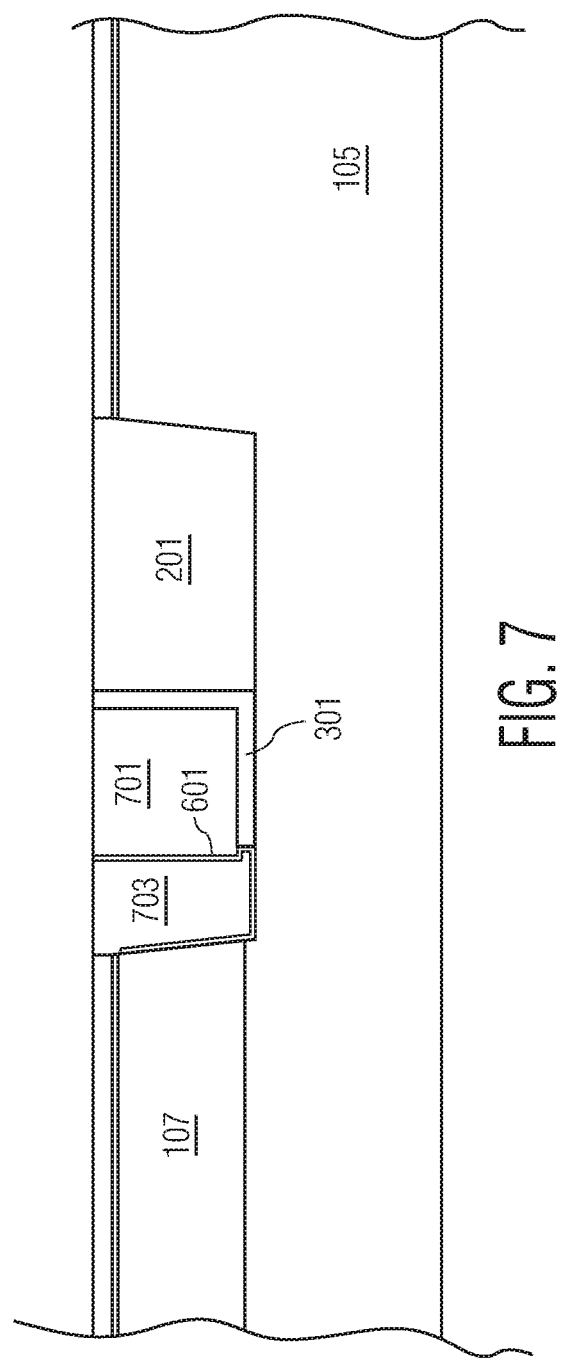

FIG. 7 is a partial cutaway side view of wafer 101 after wafer 101 has been planarized to nitride layer 111. In one embodiment, the planarization is performed in a two step process where wafer 101 is first planarized to nitride layer 203, and then planarized to nitride layer 111. As a result of the planarization, a gate structure 703 is formed from layer 603 and a field plate 701 is formed from spacer 401.

Figure 8:
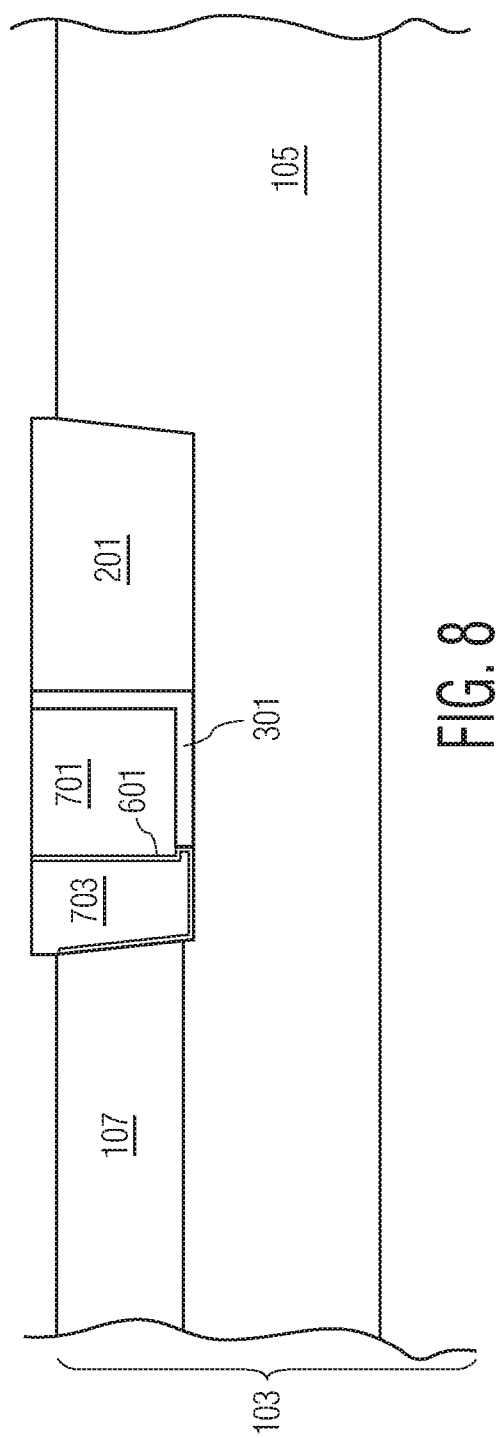

FIG. 8 is a partial cutaway side view of wafer 101 after nitride layer 111 has been etched to expose the top surface of substrate 103.

Figure 9:
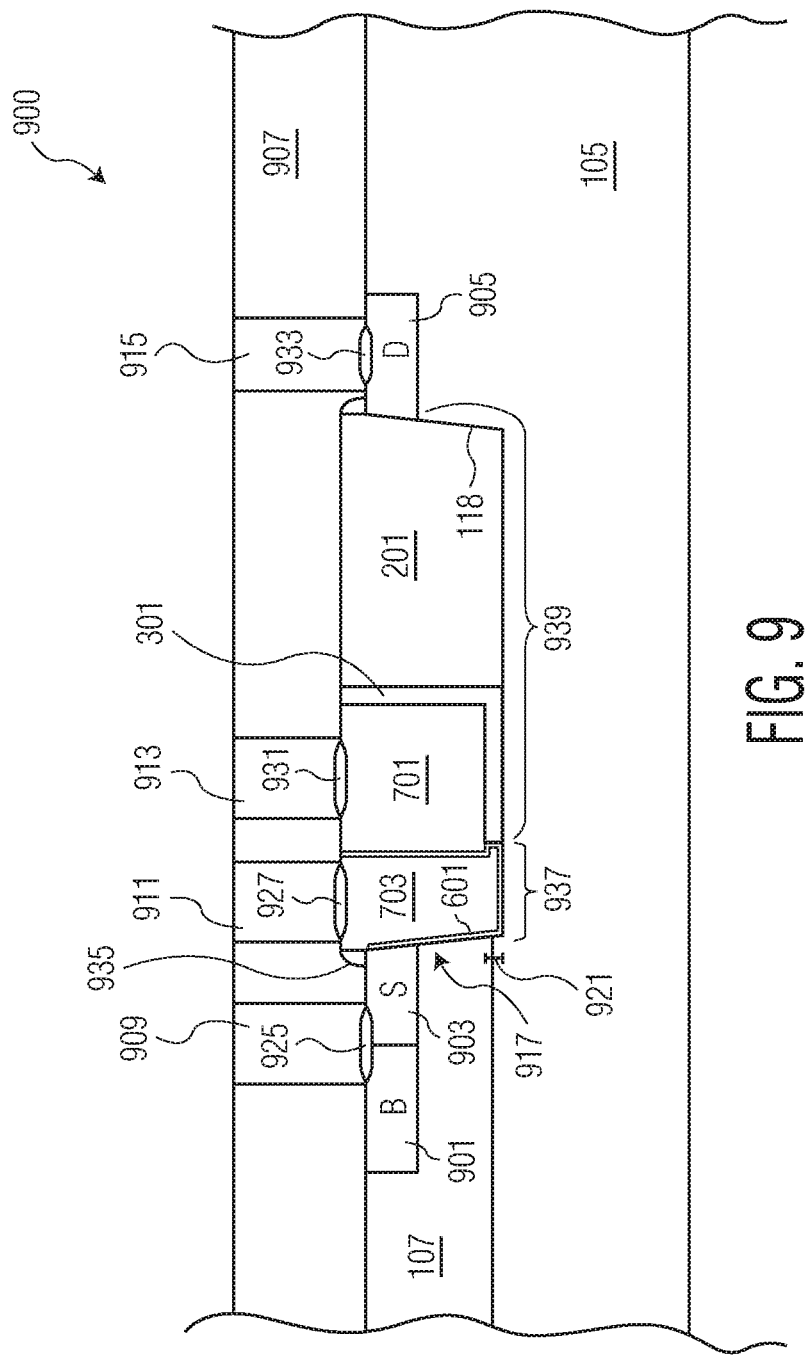

FIG. 9 is a partial cutaway side view of wafer 101 after the formation of other structures for transistor 900. N-type dopants are selectively implanted into substrate 103 through in an implant mask (not shown) to form source region 903 and drain region 905. In one embodiment, phosphorous ions are implanted into substrate 103 at a dosage of $1.5e^{15}$ cm$^{-2}$ and an energy of 50 Key, but other types of dopants may be implanted at other dosages and/or at other energies in other embodiments.

In the embodiment shown, P-type dopants are implanted through another implant mask (not shown) into substrate 103 to form body contact region 901. In one embodiment, region 901 is formed by selectively implanting through a mask, boron ions at a dose of $1.5e^{15}$ cm$^{-2}$ and at an energy of at 20 keV into substrate 103. Implantation is followed by an annealing step, e.g. rapid thermal annealing (RTA). Other P-type dopants may be implanted at other doses and/or at other energies in other embodiments.

In the embodiment shown, body contact region 901 is formed immediately adjacent to source region 903. However, in other embodiments, the body contact regions and source regions may be laterally separated. A nitride spacer 935 is formed to provide separation between gate structure 703 and source region 903.

Contacts 909, 911, 913, and 915 are formed to be electrically coupled to the structures of transistor 900. Prior to the formation of the contacts, a layer 907 of dielectric material is formed over wafer 101. In one embodiment, layer 907 is an oxide layer form by a TEOS process. Openings are then formed in layer 907. Afterwards, exposed silicon in the openings is silicided to form silicide structures 925, 927, 931, and 933. In one embodiment, the silicide structures are formed by depositing a metal (e.g. tungsten) over wafer 101, heating the wafer, and then removing the unreacted metal. Other embodiments may not include the silicide structures.

After the formation of the silicide structures, conductive contacts are formed in the openings to electrically contact the silicide structures. In one embodiment, the contacts are formed of a metal (e.g. tungsten, titanium). Contact 909 electrically contacts silicide structure 925 which contacts body contact region 901 and source region 903. Contact 911 electrically contacts silicide structure 927 which contacts gate structure 703. Contact 913 electrically contacts silicide structure 931 which contacts field plate 701. Contact 915 electrically contacts silicide structure 933 which contacts drain region 905.

As shown in FIG. 9, transistor 900 includes a source region 903, a drain region 905, a gate structure 703, a channel region 917 located in well region 107 along sidewall 116 between source region 805 and region 105, and a field plate 701. Transistor 900 also includes an extended drain region that extends from P well region 107, under trench 115, along sidewall 118, to drain region 905. The drain extension region includes an accumulation region 937 and a drift region 939.

In the embodiment shown, when a voltage is applied to field plate 701, the field plate 701 more evenly distributes the voltage drop in the drift region 939 from the drain region 905 to the accumulation region 937.

As shown in FIG. 9, gate structure 703 has a dielectric vertical separation from the bottom portion 120 of trench equal to the thickness of layer 601. The lateral separation between gate structure 703 and channel region 917 is also the thickness of layer 601. Field plate 701 has a vertical separation 921 of the thickness of layer 301. Accordingly, one advantage of the methods described herein is that the gate structure 703 and field plate 701 can be at different vertical distances from the bottom surface of trench 115 in the semiconductor substrate 103.

Another advantage with the processes shown herein is that the width of the accumulation region 937 can be adjusted separately from vertical dielectric separation 921. Vertical separation 921 depends on the thickness of layer 301. The width of accumulation region 937 is dependent upon the thickness of layer 301, the lateral distance of sidewall 207 to sidewall 116, the thickness of layer 303, the thickness of layer 601, and the amount of etching of layer 301 under spacer 401 (See FIG. 5).

Also, with the transistor of FIG. 9, field plate 701 is laterally separated from sidewall 118 by a greater distance than gate structure 703 is laterally separated from sidewall 116. Such a feature may provide a transistor with a higher breakdown voltage by providing a greater amount of dielectric for a voltage drop from a higher drain region voltage (e.g. 20-120 Volts) to a lower gate voltage in an off-state mode (gate at 0 Volts). See the discussion of FIG. 10 below.

In one embodiment, transistor 900 is characterized as an N-type, laterally diffused metal oxide semiconductor (LDMOS) trench transistor. In other embodiments, a P-type LDMOS may be formed where the doping conductivity types of some of the regions are switched. However, other types of transistors may be formed with processes described herein in other embodiments.

After the stage shown in FIG. 9, other processes may be performed on wafer 101 such as forming additional interconnect layers. Afterwards, external terminals e.g. bond pads are formed on wafer 101. Wafer 101 is then singulated into multiple die where each die includes a transistor similar to transistor 900. Afterwards, the die are packaged in semiconductor packaging material to form integrated circuit packages where they are shipped to end use manufacturers to include in end use products such as automobiles, battery control systems, and industrial equipment. In other embodiments, a transistor device may include other structures and/or may be formed by other processes. Furthermore, additional process steps may be added to form other components on the same die.

Figure 10:
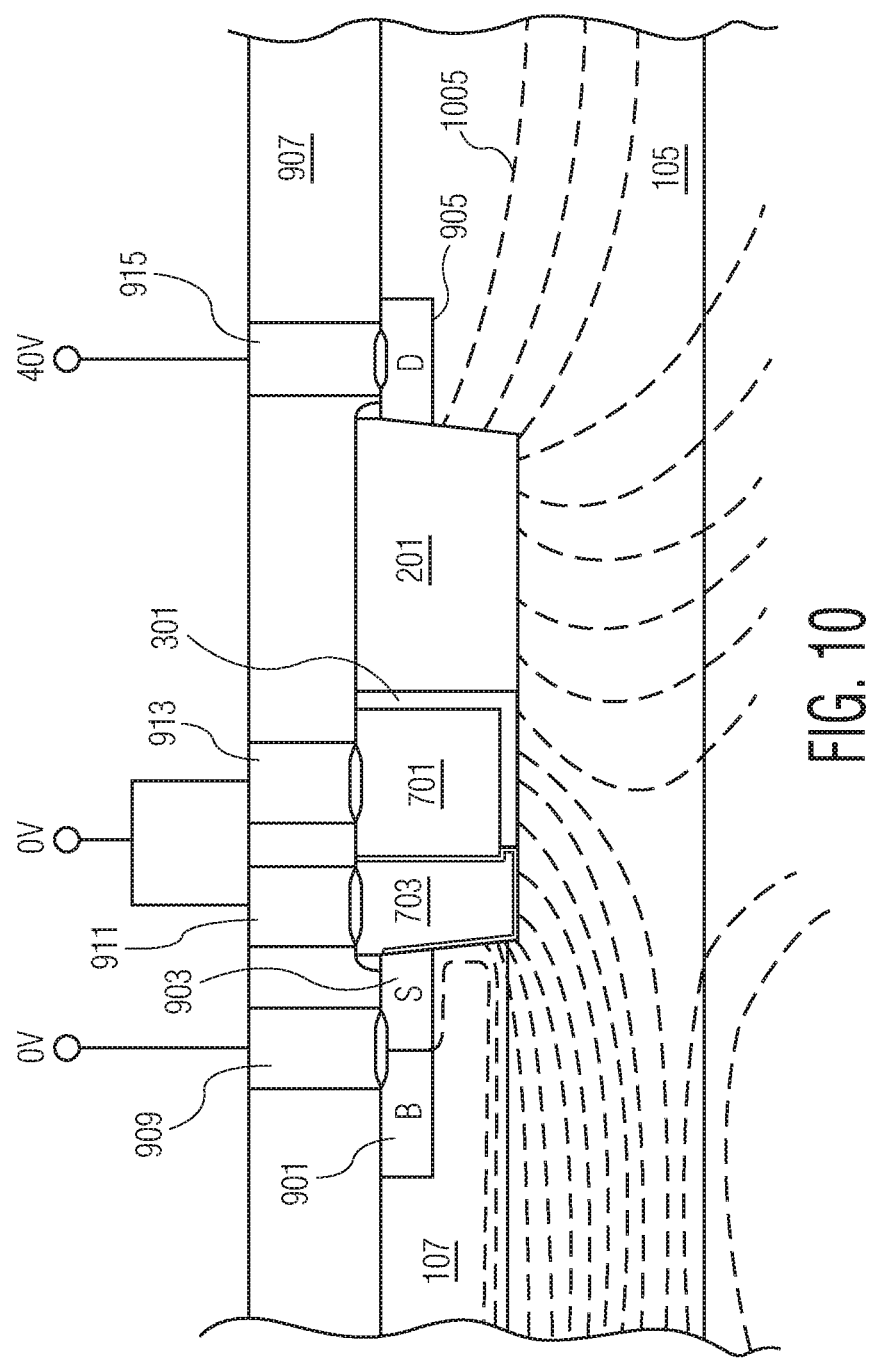
FIG. 10 is a partial side view illustration showing potential fields and the electrical coupling of a transistor device during an operating condition according to one embodiment of the present invention.

FIG. 10 shows a partial cross-sectional side view of transistor 900 during an off-state mode of operation according to one embodiment. In the embodiment shown, gate structure 703, field plate 701, source region 903, and body contact region 901 are each grounded (0 V). 40 Volts is applied to drain region 905.

FIG. 10 shows the equipotential lines 1005 representing the electrostatic fields of transistor 900 that occur in substrate 103 during the above described condition. As can be shown in FIG. 10, the electrostatic potential between the higher drain voltage (40 V) and the lower source voltage (ground) is distributed in the drain extension region that extends from the drain region 805 to the P well region 107. In one embodiment, the amount of voltage sustained by transistor 900 is dependent upon the width of trench 115, the depth of trench 115, the thickness of layer 301, the depth and doping concentration of the P well region 107 and region 105, and the depth of drain region 905 with respect to the depth of trench 115. In one embodiment, the breakdown voltage of transistor 900 is in the range of 10V to 150V, but may be of other voltages in other embodiments. Not shown are the equipotential lines in the dielectric material remaining of layer 201 located in trench 115.

Having the channel region 917 and a portion of the drift region 939 be vertical allows for a reduction in area of the die over a planar transistor. Having a portion of the drift region 939 be horizontal allows for a transistor to be easily scalable for adjusting the breakdown voltage by increasing or decreasing the width of trench 115. In some embodiments, the length of channel region 917 can be adjusted by varying the depth of the P-well region 107 and/or the source region 903.

In the embodiment of FIG. 10, gate structure 703 and field plate 701 are electrically tied together (e.g. by interconnects (not shown) located above layer 907). However, in other embodiments, gate structure 701 and field plate 701 would not be electrically tied together. In one embodiment, Field plate 701 would be electrically tied to source region 903/body contact region 901. One advantage that may occur with the process shown in FIGS. 1-9 is that gate structure 703 and field plate 701 can be separately biased.

Figure 11:
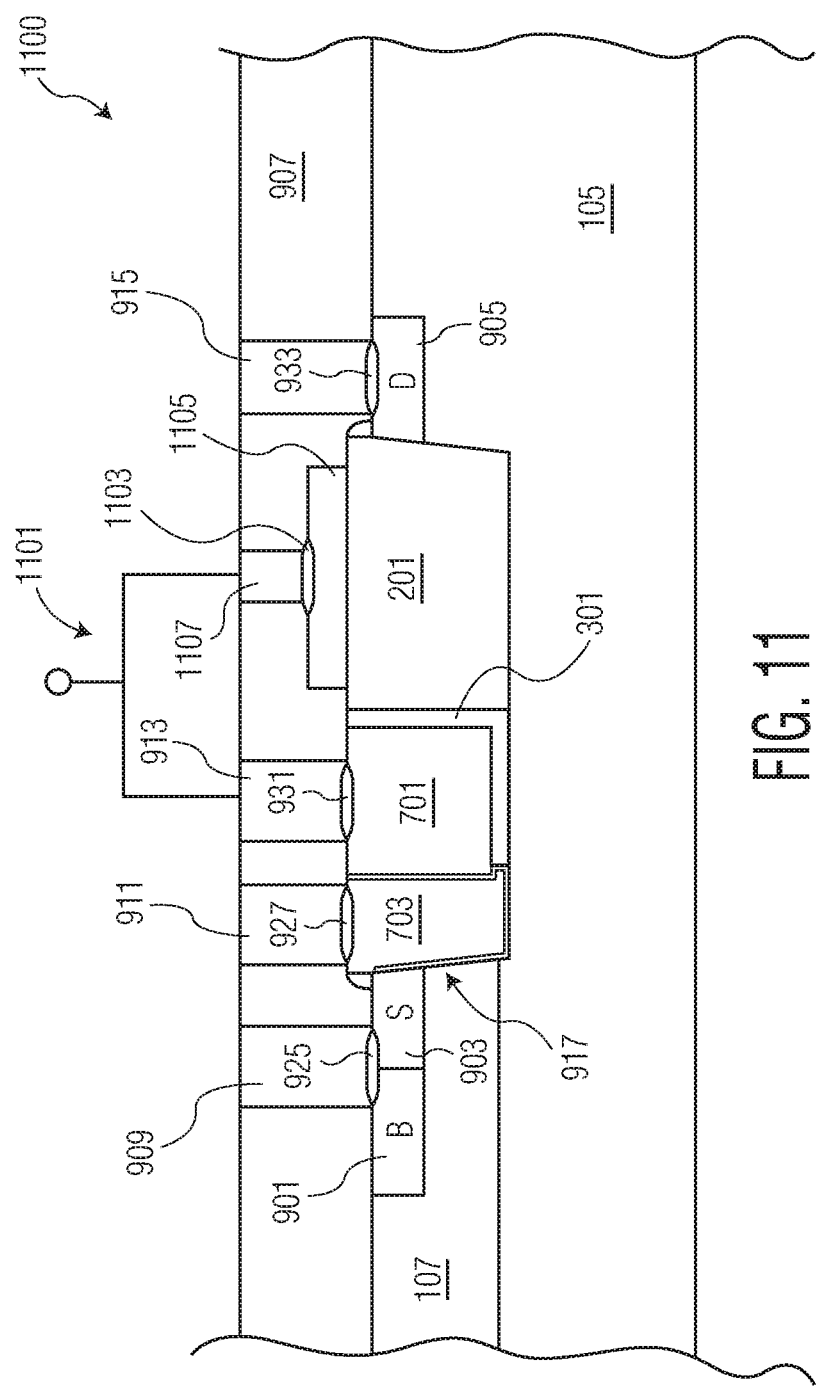
FIG. 11 sets forth a partial cutaway side view of a stage in the manufacture of a transistor device according to another embodiment of the present invention.

FIG. 11 shows a partial cutaway side view of wafer 1100 that includes a transistor 1101 according to another embodiment of the present invention. In the embodiment shown, wafer 1100 is similar to wafer 101, with the structures in FIG. 11 being similar to the structures in FIG. 9 that have the same identification numbers.

In the embodiment of FIG. 11, transistor 1101 includes an additional conductive field plate structure 1105 that is formed over the remaining portion of layer 201. In one embodiment, structure 1105 is lithographically defined where a layer of conductive material (not shown) is etched as per a lithographically defined mask. In one embodiment, structure 1105 is formed from a layer of polysilicon that is used to form gate structures of planar transistors (not shown) at other locations of wafer 1100. Structure 1105 is electrically coupled to contact 1107 (through silicide 1103) which is electrically coupled to contact 913 to be biased at the same voltage during operation.

In some embodiments, providing an additional field plate structure (1105) allows for a transistor to handle higher voltage differentials and thereby increase the breakdown voltage of the transistor. In some embodiments the additional field plate structure (1105) can be connected to the source contact (909), which may help in some embodiments, in lowering the capacitive coupling ($C_{gd}$) between gate and drain. Such a configuration may be beneficial in improving the Switching Time (Turn-On/Turn-Off Time).

Figure 12:
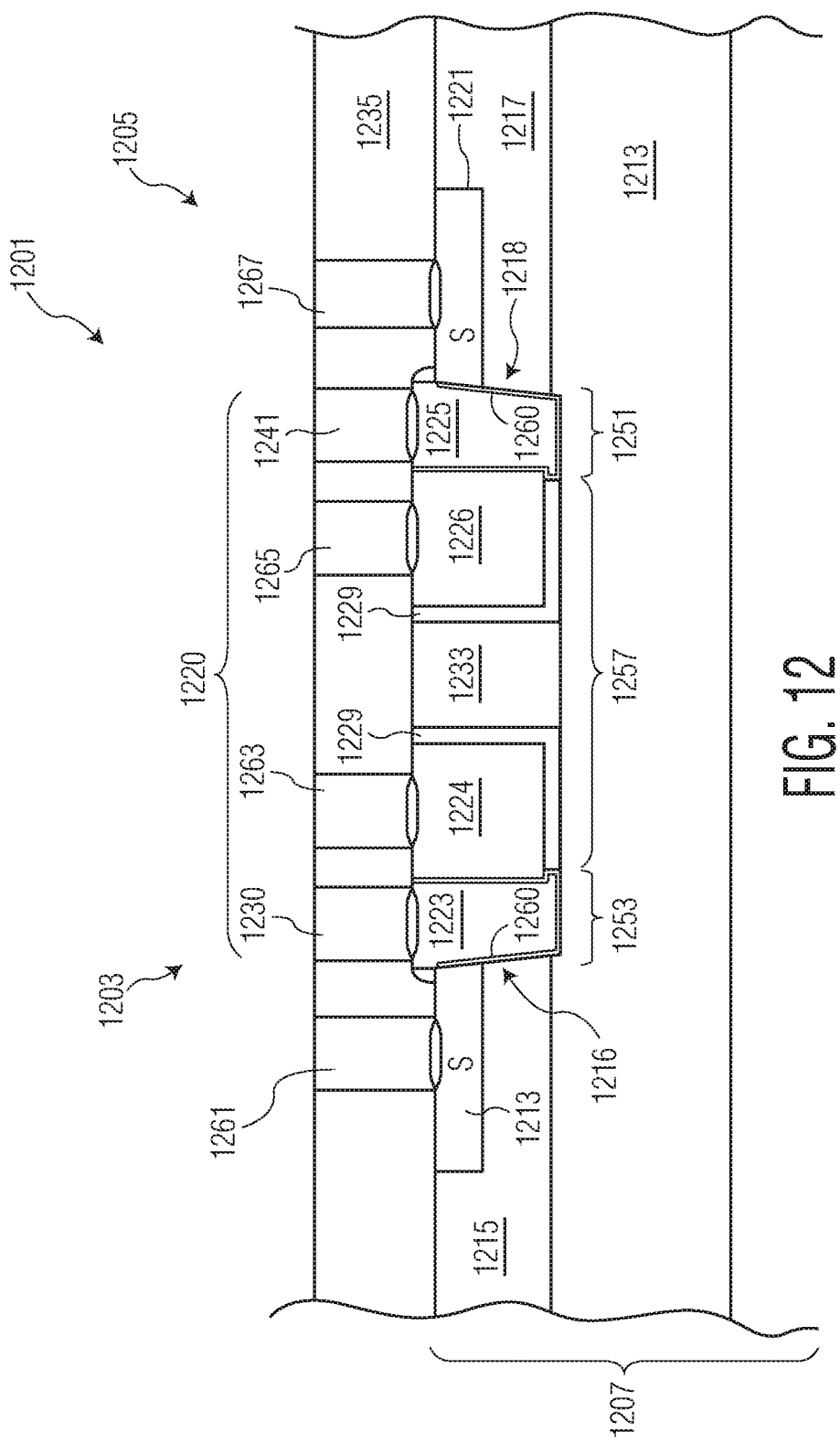
FIG. 12 sets forth a partial cutaway side view of a stage in the manufacture of a transistor device according to another embodiment of the present invention.

FIG. 12 shows a partial cutaway side view of wafer 1201 that includes a transistor device according to another embodiment of the present invention. Wafer 1201 includes transistors 1203 and 1205 which include structures implemented in a semiconductor substrate 1207. Transistor 1203 includes an N-type source region 1219, a channel region 1216 located in P well region 1215, a gate structure 1223, and a field plate 1224. Transistor 1205 includes an N-type source region 1221, a channel region 1218 located in P well region 1217, a gate structure 1225, and a field plate 1226. Gate contact 1230 is electrically coupled to gate structure 1223 and gate contact 1241 is electrically coupled to gate structure 1225. Source contact 1261 is electrically coupled to source region 1219 and source contact 1267 is electrically coupled to source region 1221. Field plate contact 1263 is electrically coupled to field plate 1224 and field plate contact 1265 is electrically coupled to field plate 1226. The contacts are located in dielectric layer 1235. Dielectric structure 1233 and oxide layer 1229 separate field plates 1224 and 1226. Transistors 1203 and 1205 include a gate dielectric layer 1260. In the embodiment shown, the body contact regions (not shown) are located outside the view of FIG. 12, but they may be located immediately adjacent to the source regions in other in other embodiments.

In one embodiment, gate structures 1223 and 1225 are formed in a similar manner to the formation of gate structure 703 and field plates 1224 and 1226 are formed in a similar manner as field plate 701, except that both sidewalls of trench 1220 in the semiconductor substrate 1207 are exposed after etching of a layer similar to layer 201 (see FIG. 2). In the embodiment of FIG. 12, dielectric structure 1223 is the remaining portion of the layer similar to layer 201. With the embodiment of FIG. 12, two opposite sidewalls of the layer (similar to layer 201) are formed in trench 1220 instead of one sidewall (207, see FIG. 2) as formed from layer 201 in trench 115. Layer 1229 is similar to layer 301. Accordingly, with the embodiment of FIG. 12, two spacers similar to spacer 401 are formed in trench 1220.

The device shown in FIG. 12 is a back-to-back bidirectional transistor device that includes transistors 1203 and 1205 coupled in a back-to-back configuration. The bidirectional transistor device can be implemented as a bidirectional switch. A bidirectional transistor device is a device that can selectively block voltages in both directions and conduct current in both directions. The drain region for both transistors 1203 and 1205 is characterized as a "virtual drain" in that it is not biased at a particular voltage with a direct external contact and it is an internal node of a bi-directional device. In the embodiment shown, a virtual extended drain region located in N type region 1213 extends from P well region 1215 to P well region 1217. The virtual extended drain region includes an accumulation region 1253 for transistor 1203, an accumulation region 1251 for transistor 1205, and a shared virtual drift region 1257.

In one embodiment, a circuit of transistors 1203 and 1205 can be utilized as a switch between a node connected to source contact 1261 and a node connected to the source contact 1267, regardless of which node is at the higher voltage.

Figure 13:
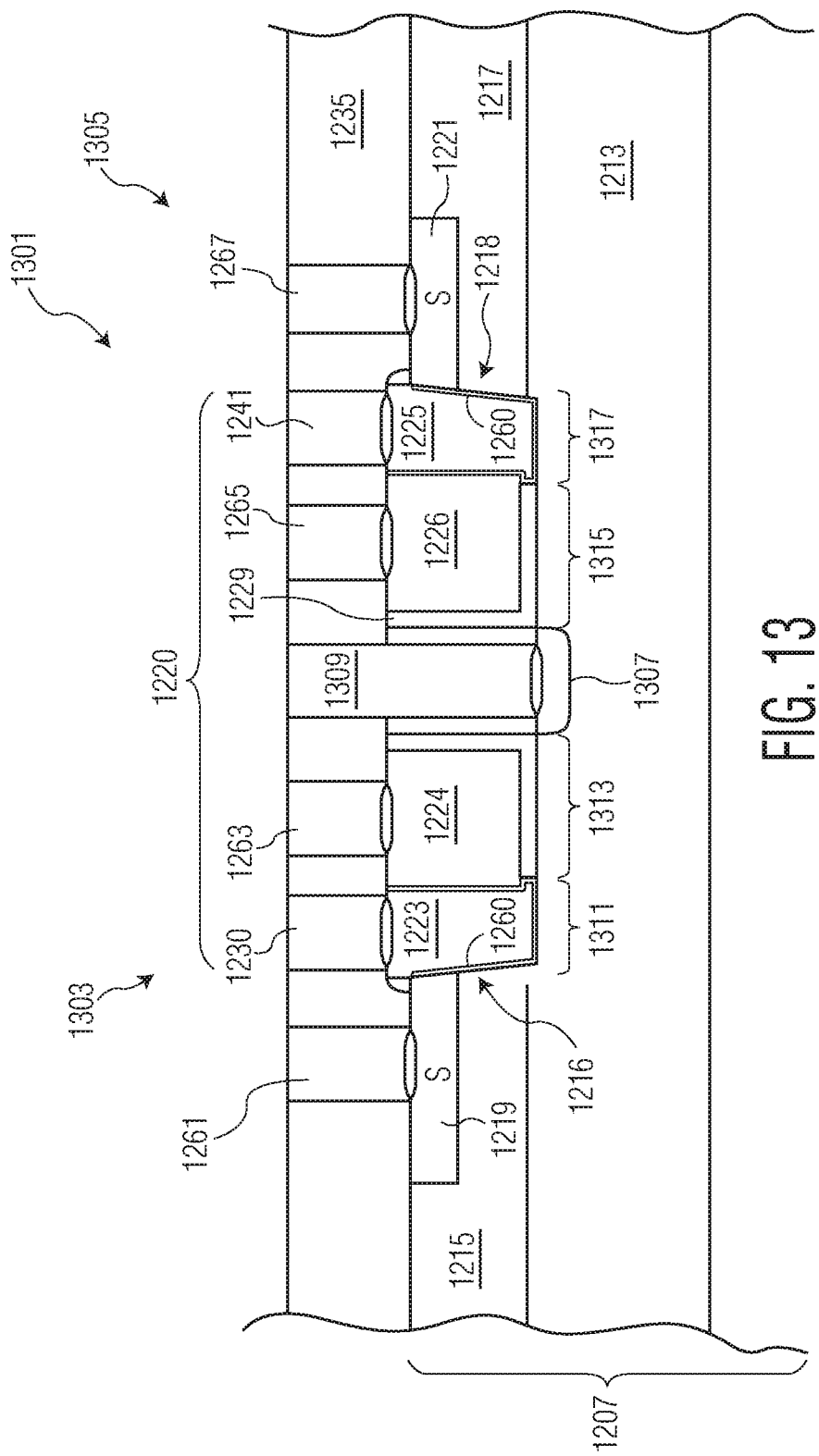
FIG. 13 sets forth a partial cutaway side view of a stage in the manufacture of a transistor device according to another embodiment of the present invention.

FIG. 13 shows a partial cutaway side view of wafer 1301 that includes a transistor device according to another embodiment of the present invention. In the embodiment shown, wafer 1301 is similar to wafer 1201, with the structures in FIG. 13 being similar to the structures in FIG. 12 that have the same identification numbers.

In the view of FIG. 13, wafer 1301 includes two transistors 1303 and 1305. Transistor 1303 includes a source region 1219, a channel region 1216, a gate structure 1223, a field plate 1224, and an extended drain region that includes accumulation region 1311 and drift region 1313. Transistor 1305 includes a source region 1221, a channel region 1218, a gate structure 1225, a field plate 1226, and an extended drain region that includes accumulation region 1317 and drift region 1315.

Transistors 1303 and 1305 are different from transistors 1203 and 1205 in that transistors 1303 and 1305 have a shared drain region 1307 that is biased through drain contact 1309. In one embodiment, the dielectric structure (e.g. similar to dielectric structure 1233) located between field plates 1224 and 1226 is removed to expose substrate 1207. Afterwards, N type dopants are implanted into substrate 1207 to form drain region 1307. Dielectric material layer 1235 is then deposited over wafer 1301 wherein contact openings are formed in material layer 1235 for the contacts including for drain contact 1309. However, transistors 1303 and 1305 may be formed by other methods in other embodiments.

Figure 14:
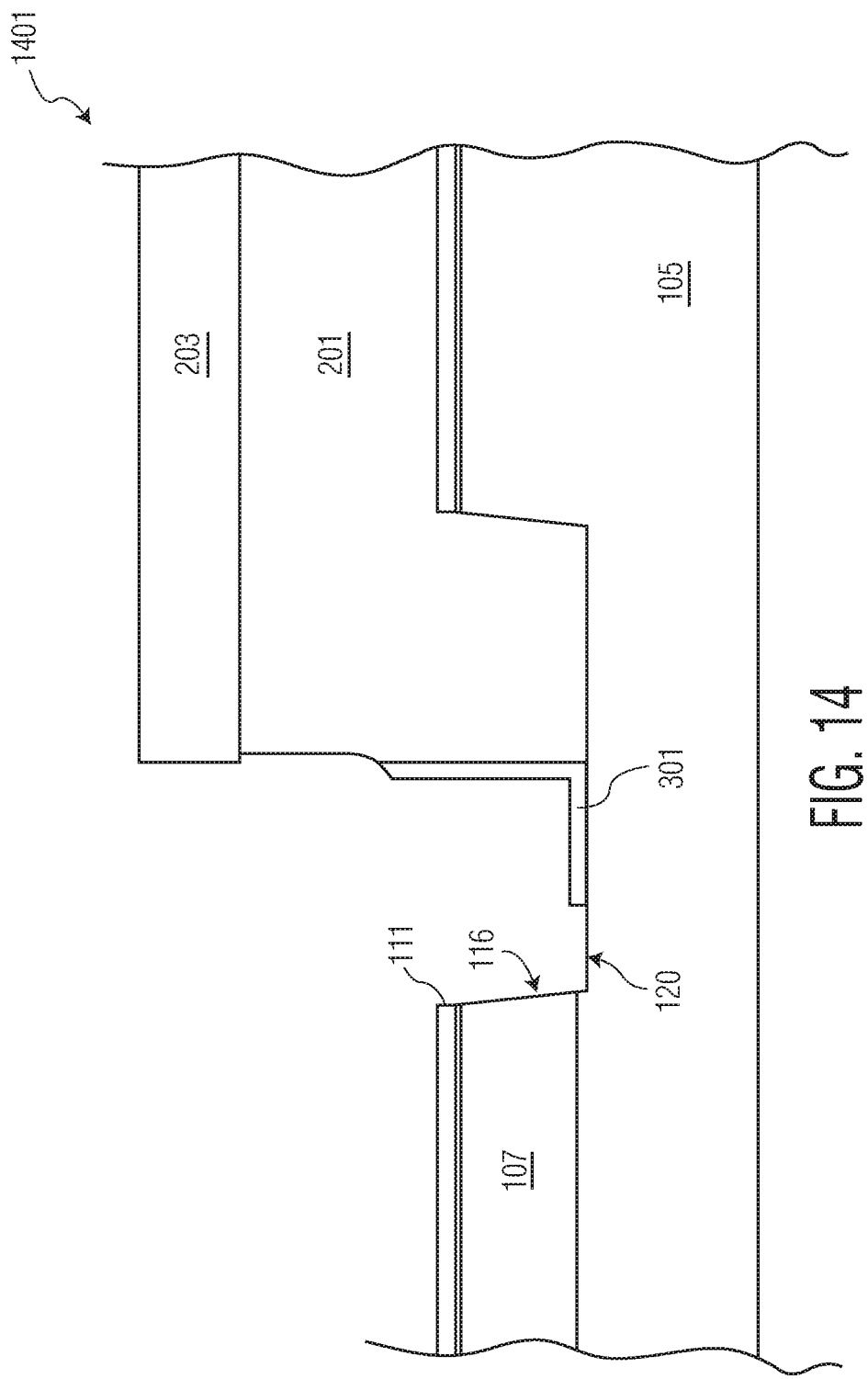
FIGS. 14-15 set forth partial cutaway side views of various stages in the manufacture of a transistor device according to another embodiment of the present invention.
Figure 15:
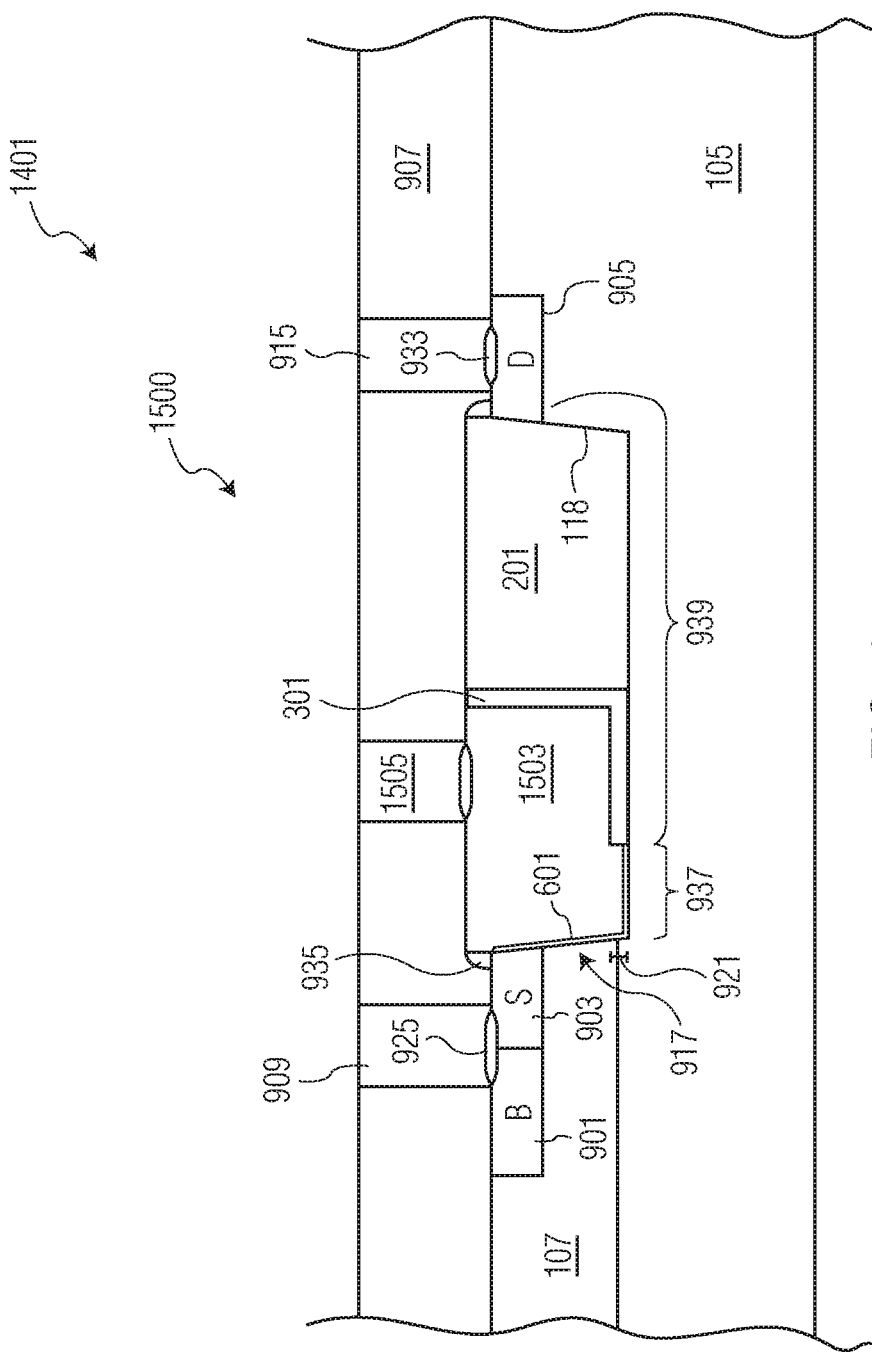

FIGS. 14-15 set forth partial cutaway side views of various stages of a wafer in the manufacture of a transistor device according to another embodiment of the present invention. In the embodiment of FIGS. 14-15, the spacer 401 of FIG. 4 is removed and a transistor with a combination gate/field plate structure is formed.

FIG. 14 is a stage in the manufacture of a transistor device on wafer 1401 that is after the stage of FIG. 5. In the embodiment shown, wafer 1401 is similar to wafer 101, with the structures in FIG. 14 being similar to the structures in FIG. 5 that have the same identification numbers. As shown in FIG. 14, after layer 301 is removed, spacer 401 is removed (see from FIG. 5) with an etch chemistry appropriate to remove the material of spacer 401.

FIG. 15 shows a stage in the manufacture of a transistor device on wafer 1401 that is similar to the stage of FIG. 9 except that a gate/field plate structure 1503 is formed in trench 115 instead of a separate gate structure 703 and field plate structure 701 as with FIG. 9. Other structures in FIG. 14 being similar to the structures in FIG. 9 that have the same identification numbers.

Structure 1503 serves as both a gate and a field plate for transistor 1500. In the embodiment shown, when a voltage is applied to conductive structure 1503 (via contact 1505), the field plate portion more evenly distributes the voltage drop in the drift region 939 from the drain region 905 to the accumulation region 937.

As shown in FIG. 15, the gate portion of structure 1503 directly above the accumulation region (937) has a dielectric vertical separation from bottom portion 120 equal to the thickness of layer 601. The lateral separation between structure 1503 and channel region 917 is also the thickness of layer 601. The portion of structure 1503 directly above the drift region 939 has a vertical separation from bottom portion 120 of the thickness of layer 301. Accordingly, one advantage of structure 1503 is that it can be used for both the gate (control terminal) and field plate for a transistor and yet its spacing between the channel region 917 and drift region 939 can be individually adjusted as well as the vertical separation between the field plate portion of structure 1503 and drift region 939 to achieve desired transistor characteristics.

In other embodiments, the transistors may have other configurations, have other structures, be of other transistor types, and/or be formed by other methods.

As disclosed herein, a first structure is "directly over" a second structure if the first structure is located over the second structure in a line having a direction that is perpendicular with the generally planar major side of a wafer. For example, in FIG. 9, source contact 909 is directly over region 107. Contact 913 is not directly over drain region 905. As disclosed herein, a first structure is "directly beneath" a second structure if the first structure is located beneath the second structure in a line having a direction that is perpendicular with the generally planar major side of the wafer. For example, in FIG. 9, region 107 is directly beneath contact 909. Region region 107 is not directly beneath contact 913. One structure is "directly between" two other structures in a line if the two structures are located on opposite sides of the one structure in the line. For example, in FIG. 9, structure 701 is located directly between structure 703 and the remaining portion of layer 201 in a line in the cut away side view of FIG. 9. Contact 913 is not located directly between region 901 and region 905 in a line. "Directly laterally between" means that the line is a lateral line. A "lateral line" is a line that is parallel with a generally planar major side of the wafer. In FIG. 9, structures 703 and 701 are located in a lateral line. Region 107 and contact 913 are not located in a lateral line. As disclosed herein, a first structure is "laterally separated" from a second structure if there is separation between the two structures in a line that is parallel with a generally planar major side of the wafer. For example, in FIG. 9, region 905 and structure 701 are laterally separated from each other. As disclosed herein, a "lateral distance" is the distance in a direction that is parallel with a generally planar major side of the wafer. As disclosed herein, a "vertical distance" is the distance in a direction that is perpendicular with a generally planar major side of the wafer. A "vertical component sidewall" of a trench is a portion of a trench sidewall having a profile that overall, the majority component of the portion is vertical even though it may also have a horizontal component or that it may have minor horizontal discontinuity at an interior location of the sidewall portion. For example, a portion of a sidewall sloped at 70 degrees may be considered a vertical component sidewall portion. A sidewall spacer structure is a structure defined by its self-aligned spacing from a sidewall and is not photo lithographically defined. As disclosed herein, a spacer formed along a sidewall includes where the spacer is in contact with the sidewall or where the spacer is formed in contact with an intervening layer or layers between the spacer and the sidewall.

Features shown or described herein with respect to one embodiment may be implemented in other embodiments shown or described herein. For example, in FIGS. 12 and 13, source regions 1219 and 1221 may be each located immediately laterally adjacent to a body contact region (e.g. similar to region 901 of FIG. 9). Further as an example, the transistor devices of FIGS. 11-13 may include combination gate/field plate structures similar to structure 1503.

In one embodiment, a method for forming a transistor device includes forming a sidewall spacer of a spacer material along a first vertical component sidewall in a trench of a wafer over a layer of dielectric material in the trench. The forming results in no sidewall spacer of the spacer material formed along a second vertical component sidewall of the trench. The second vertical component sidewall facing the first vertical component sidewall. The method includes removing a portion of the layer of dielectric material from a space in the trench that is directly over a bottom portion of the trench. At least a portion of the space is not located directly beneath the sidewall spacer during the removing. The sidewall spacer prevents a second portion of the layer of dielectric material located directly under the sidewall spacer from being removed during the removing. The method includes forming a control terminal structure from a control terminal material that is deposited over the wafer, the control terminal structure including a portion located in the space, the control terminal structure is for a transistor formed on the wafer.

In another embodiment, a method for forming a transistor device includes forming a trench in a semiconductor material of a wafer. The trench includes a first vertical component sidewall, a second vertical component sidewall, and a bottom portion. The method includes forming a layer of a first material over the semiconductor material including in the trench and patterning the layer of first material to form a third vertical component sidewall of the first material that extends into the trench. The third vertical component sidewall facing the first vertical component sidewall. The method includes forming a sidewall spacer of a spacer material along the third vertical component sidewall in the trench over a layer of dielectric material in the trench. The forming results in no sidewall spacer of the spacer material being formed along the first vertical component sidewall. The method includes removing a first portion of the layer of dielectric material from a space in the trench that is directly over the bottom portion of the trench. The sidewall spacer prevents a second portion of the layer of dielectric material located directly under the sidewall spacer from being removed during the removing. The space is located directly laterally between the first vertical component sidewall and the second portion. The method includes forming a control terminal structure of control terminal material that is deposited over the wafer. The control terminal structure including a portion located in the space. The control terminal structure is for a transistor.

In another embodiment, a method for forming a transistor device includes in a trench in a wafer that includes a first vertical component sidewall, a second vertical component sidewall, and a bottom portion, wherein the second vertical component sidewall has a height greater than the first vertical component sidewall, forming a dielectric layer at least along the bottom portion and along the first vertical component sidewall. The method includes depositing a layer of spacer material over the wafer including in the trench and anisotropically etching the spacer material to leave a sidewall spacer of the spacer material along the second vertical component sidewall wherein no sidewall spacer of spacer material is located along the first vertical component sidewall. The method includes removing a first portion of the dielectric layer along the bottom portion of the trench in a first space of the trench. A second portion of the dielectric layer located directly beneath the sidewall spacer remains after the removing, the first space is located directly laterally between the first vertical component sidewall and the second portion. The method includes forming a control terminal structure of a transistor, the control terminal structure including a portion located in the first space.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A method for forming a transistor device comprising:
   forming a sidewall spacer of a spacer material along a first vertical component sidewall in a trench of a wafer over a layer of dielectric material in the trench, wherein the forming results in no sidewall spacer of the spacer material formed along a second vertical component sidewall of the trench, the second vertical component sidewall facing the first vertical component sidewall;

removing a portion of the layer of dielectric material from a space in the trench that is directly over a bottom portion of the trench, wherein at least a portion of the space is not located directly beneath the sidewall spacer during the removing, wherein the sidewall spacer prevents a second portion of the layer of dielectric material located directly under the sidewall spacer from being removed during the removing;

forming a control terminal structure from a control terminal material that is deposited over the wafer, the control terminal structure including a portion located in the space, the control terminal structure is for a transistor formed on the wafer;

wherein the transistor includes a field plate that includes at least a portion of the sidewall spacer.

2. A method for forming a transistor device comprising:
forming a sidewall spacer of a spacer material along a first vertical component sidewall in a trench of a wafer over a layer of dielectric material in the trench, wherein the forming results in no sidewall spacer of the spacer material formed along a second vertical component sidewall of the trench, the second vertical component sidewall facing the first vertical component sidewall;

removing a portion of the layer of dielectric material from a space in the trench that is directly over a bottom portion of the trench, wherein at least a portion of the space is not located directly beneath the sidewall spacer during the removing, wherein the sidewall spacer prevents a second portion of the layer of dielectric material located directly under the sidewall spacer from being removed during the removing;

forming a control terminal structure from a control terminal material that is deposited over the wafer, the control terminal structure including a portion located in the space, the control terminal structure is for a transistor formed on the wafer;

wherein the first vertical component sidewall has a greater height than the second vertical component sidewall during the forming the sidewall spacer.

3. The method of claim 2 wherein the first vertical component sidewall has at least twice a height as the second vertical component sidewall.

4. The method of claim 1 wherein the forming the sidewall spacer includes depositing the spacer material along the second vertical component sidewall and anisotropically etching the spacer material to remove the spacer material from along the second vertical component sidewall.

5. The method of claim 1 further wherein the layer of dielectric material is formed over the wafer in contact with the first vertical component sidewall, wherein the sidewall spacer is in contact with the layer of dielectric material along the first vertical component sidewall.

6. A method for forming a transistor device comprising:
forming a sidewall spacer of a spacer material along a first vertical component sidewall in a trench of a wafer over a layer of dielectric material in the trench, wherein the forming results in no sidewall spacer of the spacer material formed along a second vertical component sidewall of the trench, the second vertical component sidewall facing the first vertical component sidewall;

removing a portion of the layer of dielectric material from a space in the trench that is directly over a bottom portion of the trench, wherein at least a portion of the space is not located directly beneath the sidewall spacer during the removing, wherein the sidewall spacer prevents a second portion of the layer of dielectric material located directly under the sidewall spacer from being removed during the removing;

forming a control terminal structure from a control terminal material that is deposited over the wafer, the control terminal structure including a portion located in the space, the control terminal structure is for a transistor formed on the wafer;

wherein the space is located directly laterally between the second vertical component sidewall and a location directly beneath the sidewall spacer.

7. The method of claim 1 wherein the spacer material is a polycrystalline semiconductor material.

8. The method of claim 6 wherein the transistor includes a field plate that includes at least a portion of the sidewall spacer.

9. The method of claim 1 further comprising after the removing a portion of the layer of dielectric material and prior to forming the control terminal structure, removing the sidewall spacer.

10. The method of claim 1 wherein the transistor includes a vertical channel region located in a semiconductor material, wherein the control terminal structure is located directly laterally between the vertical channel region and the first vertical component sidewall.

11. A method for forming a transistor device comprising:
forming a trench in a semiconductor material of a wafer, the trench including a first vertical component sidewall, a second vertical component sidewall, and a bottom portion;

forming a layer of a first material over the semiconductor material including in the trench;

patterning the layer of first material to form a third vertical component sidewall of the first material that extends into the trench, the third vertical component sidewall facing the first vertical component sidewall;

forming a sidewall spacer of a spacer material along the third vertical component sidewall in the trench over a layer of dielectric material in the trench, wherein the forming results in no sidewall spacer of the spacer material being formed along the first vertical component sidewall;

removing a first portion of the layer of dielectric material from a space in the trench that is directly over the bottom portion of the trench, wherein the sidewall spacer prevents a second portion of the layer of dielectric material located directly under the sidewall spacer from being removed during the removing, the space is located directly laterally between the first vertical component sidewall and the second portion;

forming a control terminal structure of control terminal material that is deposited over the wafer, the control terminal structure including a portion located in the space, the control terminal structure is for a transistor.

12. The method of claim 11 wherein a channel region of the transistor is located in the semiconductor material including along a portion of the first vertical component sidewall.

13. The method of claim 12, further comprising implanting conductivity dopants of a first type into the semiconductor material along a second portion of the first vertical component sidewall above the first portion of the first vertical component sidewall for forming a source region of the transistor.

14. The method of claim 13 further comprising implanting conductivity dopants of a first type into the semiconductor material along a portion of the second vertical component sidewall for forming a source region for a second transistor.

15. The method of claim 13 further comprising implanting conductivity dopants of a first type into the semiconductor material along a portion of the second vertical component sidewall for forming a drain region for the transistor.

16. The method of claim 11 wherein:
the patterning the layer of first material forms a fourth vertical component sidewall of the first material that extends into the trench, the fourth vertical component sidewall facing the second vertical component sidewall;
the method includes forming a second sidewall spacer of the spacer material along the fourth vertical component sidewall in the trench over the layer of dielectric material in the trench, wherein the forming results in no sidewall spacer of the spacer material being formed along the second vertical component sidewall;
the method further includes removing a third portion of the layer of dielectric material from a second space in the trench that is directly over the bottom portion of the trench, wherein the second sidewall spacer prevents a fourth portion of the layer of dielectric material located directly under the second sidewall spacer from being removed during the removing, the second space is located directly laterally between the second vertical component sidewall and the fourth portion;
the method further includes forming a second control terminal structure of the control terminal material, the second control terminal structure including a portion located in the second space, the second control terminal structure for a second transistor.

17. The method of claim 11 further comprising forming a field plate structure for the transistor located directly over the first material located in the trench.

18. The method of claim 11 further comprising planarizing the wafer to remove a portion of the first material located outside the trench after the forming a sidewall spacer.

19. A method for forming a transistor device comprising:
in a trench in a wafer that includes a first vertical component sidewall, a second vertical component sidewall, and a bottom portion, wherein the second vertical component sidewall has a height greater than the first vertical component sidewall, forming a dielectric layer at least along the bottom portion and along the first vertical component sidewall;
depositing a layer of spacer material over the wafer including in the trench;
anisotropically etching the spacer material to leave a sidewall spacer of the spacer material along the second vertical component sidewall wherein no sidewall spacer of spacer material is located along the first vertical component sidewall;
removing a first portion of the dielectric layer along the bottom portion of the trench in a first space of the trench, wherein a second portion of the dielectric layer located directly beneath the sidewall spacer remains after the removing, the first space is located directly laterally between the first vertical component sidewall and the second portion;
forming a control terminal structure of a transistor, the control terminal structure including a portion located in the first space.

20. The method of claim 19 wherein the first vertical component sidewall includes a semiconductor material, wherein the transistor includes a channel region including a portion located along a first portion the first vertical component sidewall and a source region including a portion located along a second portion of the first vertical component sidewall above the first portion.

* * * * *